US006828216B2

(12) United States Patent
Schwarzenbach et al.

(10) Patent No.: US 6,828,216 B2
(45) Date of Patent: Dec. 7, 2004

(54) PROCESS FOR DETACHING LAYERS OF MATERIAL

(75) Inventors: Walter Schwarzenbach, Biviers (FR); Christophe Maleville, La Terrasse (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 64 days.

(21) Appl. No.: 10/426,717

(22) Filed: May 1, 2003

(65) Prior Publication Data
US 2003/0216008 A1 Nov. 20, 2003

(30) Foreign Application Priority Data
May 2, 2002 (FR) .............................. 02 05500

(51) Int. Cl.⁷ .................... H01L 21/30; H01L 21/46
(52) U.S. Cl. ..................... 438/458; 438/799
(58) Field of Search ................. 438/458, 799

(56) References Cited

U.S. PATENT DOCUMENTS

| 6,211,041 B1 | | 4/2001 | Ogura ..................... 438/458 |
| 6,287,941 B1 | * | 9/2001 | Kang et al. ............... 438/459 |
| 6,303,468 B1 | | 10/2001 | Aspar et al. .............. 438/455 |
| 6,368,038 B1 | | 4/2002 | Uno ....................... 411/161 |
| 6,461,939 B1 | * | 10/2002 | Furihata et al. ........... 438/459 |
| 6,506,665 B1 | * | 1/2003 | Sato ....................... 438/458 |
| 6,540,827 B1 | * | 4/2003 | Levy et al. ................ 117/3 |
| 2003/0008477 A1 | * | 1/2003 | Kang et al. ............... 438/458 |
| 2003/0216008 A1 | * | 11/2003 | Schwarzenbach et al. .... 438/458 |
| 2004/0110320 A1 | * | 6/2004 | Aspar et al. .............. 438/110 |
| 2004/0115900 A1 | * | 6/2004 | Huang et al. .............. 438/458 |

FOREIGN PATENT DOCUMENTS

EP    0 954 014 A1    11/1999

* cited by examiner

Primary Examiner—Alexander Ghyka
(74) Attorney, Agent, or Firm—Winston & Strawn LLP

(57) ABSTRACT

A process for detaching two layers of material according to a weakened zone defined between the layers. This process includes the thermal annealing of a structure that incorporates the layers, with the annealing bringing the temperature from a starting temperature to a final annealing temperature while evolving according to a first phase up to a transition temperature, then according to a second phase during which the rise in temperature per unit of time is greater than that of the first phase. The invention also concerns an application for using this process in a particular semiconductor fabrication technique.

15 Claims, 3 Drawing Sheets

Figure 1:
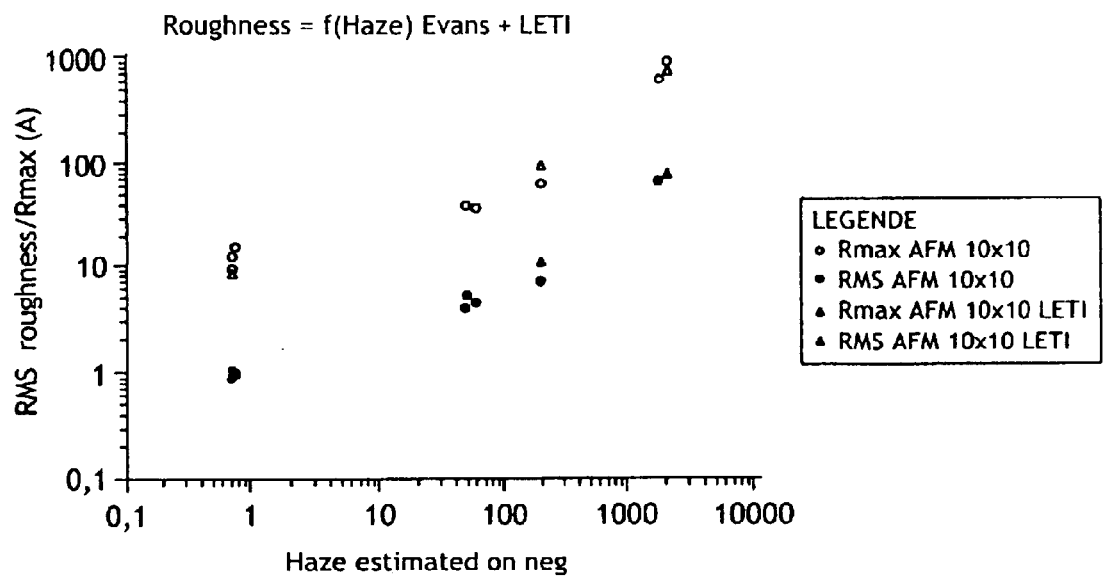

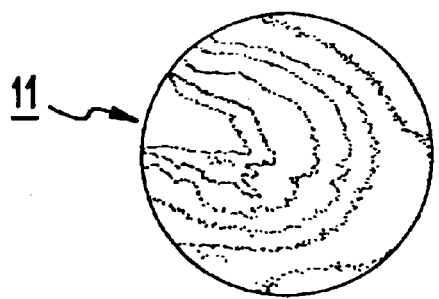
FIG_4a
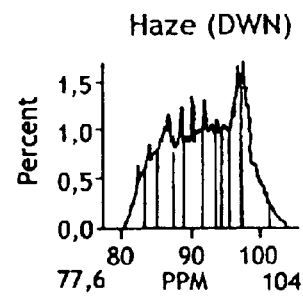
FIG_4b
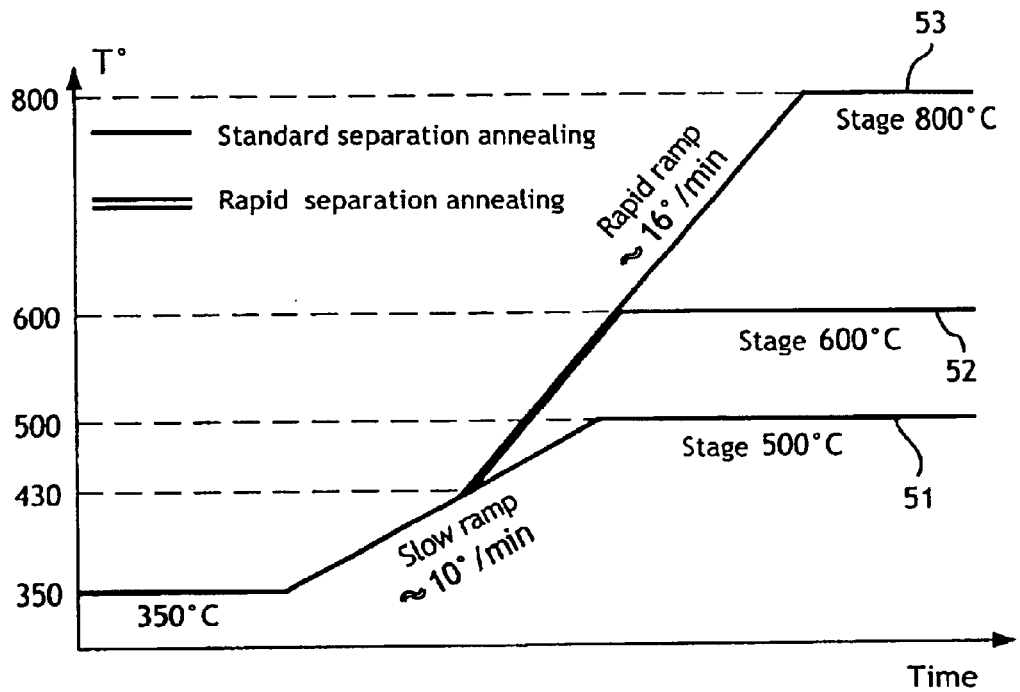
FIG_5
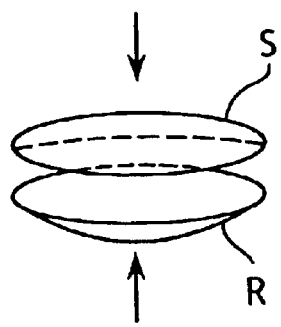
FIG_6

FIG_7a
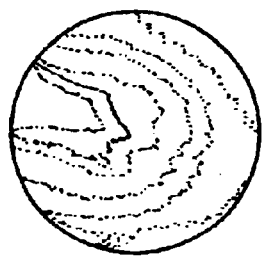
FIG_8a
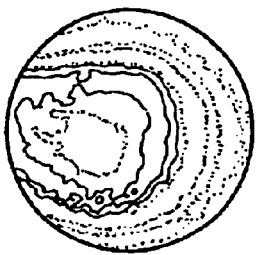
FIG_9a
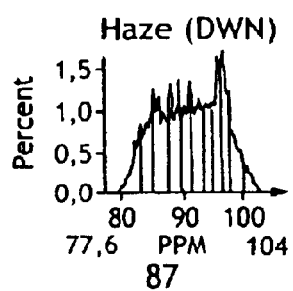
FIG_7b
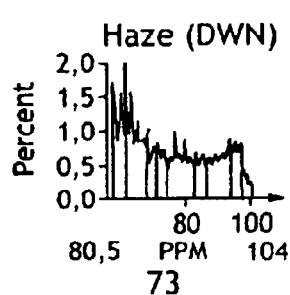
FIG_8b
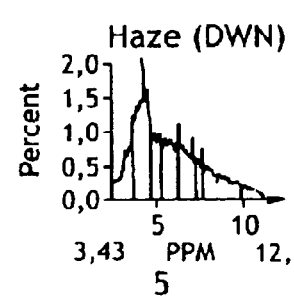
FIG_9b
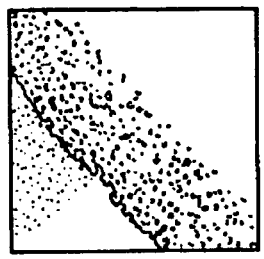
FIG_10
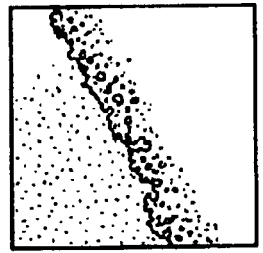
FIG_11
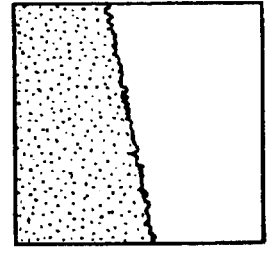
FIG_12

PROCESS FOR DETACHING LAYERS OF MATERIAL

BACKGROUND ART

The present invention generally relates to the processing of materials, and more particularly to substrates for electronics, optics or optoelectronics.

More precisely, the invention relates to a process for detaching two layers of material according to a weakened zone defined between the two layers. This process comprises thermal annealing of a structure of the layers, wherein the annealing brings the temperature from a starting annealing temperature to a final annealing temperature in a controlled and defined manner.

Processes of the type mentioned above are already known in general. In particular it is known to utilize these processes for detaching two layers of material coming from the same substrate, between which a weakened zone has been previously defined by implantation of species in the substrate. The implanted species can be ions or atoms. It is thus known to implant a substrate of a semiconductor material such as silicon with a species such as hydrogen or helium to obtain this weakened zone.

The weakened zone is determined as a function of the nature of the material, the nature of the implanted species and the implantation energy (this weakened zone typically being a plane or zone oriented parallel to the implantation face of the substrate).

It is also possible to produce the weakened zone by other means generally known per se, for example by constructing an intermediate region of a porous material between two regions of dense material, by constituting a layer of oxide embedded in a substrate (for example a substrate of silicon-on-insulator or SOI type), or even by bonding together two layers, with the bonding interface serving as the weakened zone.

The detachment of two layers at the weakened zone can be used to create thin layers (whose thickness can be between a fraction of a micron and several microns), as is described for example in U.S. Pat. No. 5,374,564.

This document describes a process known under the generic name of SMART-CUT®, the aim of which is to manufacture structures of the Silicon On Insulator ("SOI") type. The main steps in this process are the following:

formation of an oxide layer in a so-called upper plate of silicon, where the oxide layer corresponds to an embedded oxide layer of a SOI structure, ionic implantation of hydrogen or other ions in this upper plate so as to create the weakened zone, and to delimit the SOI structure by this zone on the one hand (i.e., the layer situated on one side of the weakened zone which includes the embedded oxide layer), while defining a silicon heel or reusable silicon substrate on the other side of the weakened zone, adhering, preferably by molecular bonding, the upper plate onto a support plate called a stiffener which can be made of silicon or another semiconductor material, and heating the structure with a view to detach and obtain an SOI structure comprising, as one layer, the stiffener or support plate, the embedded oxide layer and the layer of silicon located between the embedded oxide and the weakened zone, while also providing, as the other layer, the silicon heel located on the other side of the weakened zone, which heel can be re-used in further operations, e.g., to transfer further layers of silicon to other support substrates or stiffeners.

In this respect, the heating can be one that provides complete detachment, with the SOI and the heel effectively exiting from the annealing oven detached and as separate components, or if the thermal budget is not sufficient to complete the annealing, to aid only in effecting a separation between the SOI and the heel due to the formation of microcavities, microbubbles or microcracks in the weakened zone. The separation corresponds to a condition or state preceding detachment in which the SOI and the heel are still attached by Van der Waals force type bonds, or again by a simple suction effect of the two parts to be detached.

In this case, detachment is finalized and completed after the initial heating, for example, by introducing mechanical energy (such as the introduction of a projecting element such as a blade at the level of the weakened zone, etc.), or by further heating of the structure.

A complementary processing such as polishing is then conducted to reduce the roughness of the surface of the SOI which originates from splitting and detachment. It is usual to find roughness specifications not exceeding 5 Angstroms in root mean square ("rms") value. The measures of roughness are generally made by an atomic force microscope ("AFM"). With this type of instrument, roughness is measured on surfaces swept by the points of the AFM, ranging from $1 \times 1$ $\mu m^2$ to $10 \times 10$ $\mu m^2$ and less frequently $50 \times 50$ $\mu m^2$, or even $100 \times 100$ $\mu m^2$. It is also possible to measure the surface roughness by other methods, in particular by the bias of a haze measurement.

This method has the particular advantage of enabling rapid characterization of the uniformity of roughness on the entire surface. This haze, measured in ppm, originates from a method utilizing the properties of optical reflectivity of the surface to be characterized, and corresponds to an optical base noise diffused by the surface, in terms of its microroughness. An example of a graph illustrating the relationship between the haze and the roughness of this surface for an SOI surface is shown in FIG. 1.

The SMART-CUT® process can also be used to constitute structures other than SOI, for example Silicon On Anything ("SOA"), or even Anything On Anything ("AOA"), i.e., any material on any other material which is the same or different.

The known processes of detachment by heating generally utilize an annealing step for inducing the structure comprising the two layers to detach. This step starts at a relatively low initial heating temperature, which may be for example on the order of 350° C., to a higher detachment temperature though not exceeding a value on the order of 500° C., with a temperature evolution in the annealing oven increased in a substantially constant manner at a rate on the order of 10° C. per minute.

The detachment temperature for these detachment annealings of the prior art corresponds to a final annealing temperature. Therefore, the known detachment annealings are performed with temperature evolution according to a substantially constant temperature ramp up, with the gradient of this ramp being on the order of 10° C./min. But it is often noticed that the surfaces originating from detachment (that is, the surfaces of the two layers opposite both sides of the weakened zone after detachment) exhibit a relatively pronounced degree of roughness, thus requiring significant additional processing to be conducted in order to attain the desired surface state for further use of the components. For example, in the event of detachment of the layers of a plate of material such as silicon for constituting a SOI, completion of detachment generally results in roughness of the order of 80 Angstroms rms (in AFM measure on a field of 10*10 microns).

In order to further process the detached material, as well as to reuse the wafer from which the layer has been detached, there is a need for improving the surface roughness of these components while minimizing or without having to perform the additional processing steps.

Figure 2:
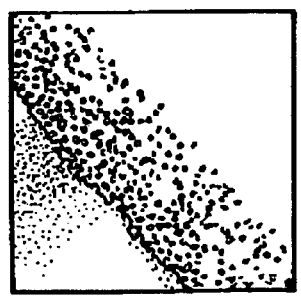

In addition, with the known detachment annealing processes, degradation of the peripheral potions of the structures to be detached is also observed. FIG. 2 illustrates the typical result of microscopic observation of the peripheral edge of the surface of an SOI after its detachment by annealing according to the prior art, with the peripheral region being called a crown or rim. This drawing shows numerous structural irregularities in the SOI crown. This figure illustrates degradation of the SOI crown, with this degradation being consequent to the detachment annealing and being applicable to structures other than SOI. Accordingly, it also would be beneficial to prevent, or at least reduce, such degradation noticed as a consequence of annealing detachment.

These disadvantages of the prior art are now remedied by the present invention.

SUMMARY OF THE INVENTION

The invention now allows one to perform detachment annealings for producing an improved state surface of the surfaces resulting from detachment. As a function of the above, the invention is more particularly directed to reducing the roughness of the surfaces resulting from detachment, relative to known processes.

These advantages are obtained in a process for detaching of two layers of material along a weakened zone defined between the layers. The process comprises thermal annealing of a structure that includes the two layers by conducting a first and second annealing phases that are separated by a transition temperature, and raising the temperature in the second annealing phase at a rate that is greater than that of the first annealing phase so as to provide an improvement in surface roughness of detached surfaces compared to those obtained by an annealing process where the temperature is uniformly raised.

Preferably, the temperature is raised in the second annealing phase at a rate that is at least 20 to 80% and more preferably at least 33 to 67% greater than that of the first annealing phase. Advantageously, the temperature rises in the first annealing phase uniformly and at a relatively slow average gradient of no greater than about 10° C./min, while the temperature rises in the second annealing phase at a relatively rapid average gradient of at least about 15° C./min or greater.

In a preferred embodiment, the material of the layers comprises a semiconductor material, and the transition temperature corresponds to a temperature that is just below that which causes detachment of the layers.

The weakened zone is advantageously created by the implanting of ions or the provision of a porous layer. When the two layers are part of a silicon on insulator structure, they can be provided by: forming an oxide layer in an upper plate of silicon, implanting ions in the upper plate to create the weakened zone which delimits the silicon on insulator structure and a silicon heel, and bonding the upper plate onto a stiffener, so that the thermal annealing detaches along the weakened zone, as one layer, a silicon on insulator structure comprising the stiffener, the embedded oxide layer and a layer of silicon located between the embedded oxide layer, and, as the other layer, a silicon heel for reuse in further operations.

BRIEF DESCRIPTION OF THE DRAWING FIGURES

Figure 3:
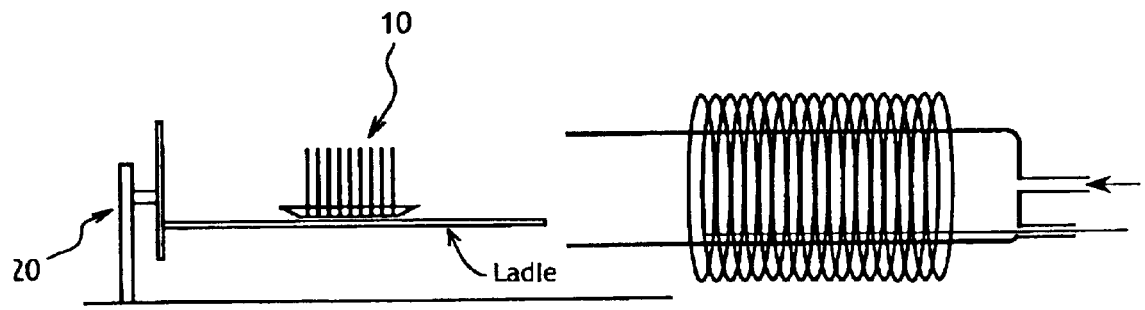

Other aspects, aims and advantages of the invention will emerge clearly from reading the following description of an embodiment of the invention, with reference to the accompanying diagrams in which:

FIG. 1 is a graph illustrating the relationship between the haze and the roughness of the surface which is obtained after detachment in the case of an SOI surface, FIG. 2 illustrates the typical result of microscopic observation of the peripheral edge of the surface of an SOI after its detachment by annealing according to the prior art, FIG. 3 diagrammatically illustrates an annealing oven used to carry out the invention, FIG. 4a illustrates the spatial distribution of haze on the surface of an SOI having undergone detachment annealing according to the prior art, FIG. 4b is a graph representing overall the distribution of haze on the surface of the SOI for the surface of which FIG. 4a illustrates the spatial distribution of haze, with the graph of FIG. 4b specifically identifying the average haze of the surface in question, FIG. 5 graphically represents the evolution of temperature during detachment annealing carried out according to the prior art, and the same type of evolution for two detachment annealings undertaken according to the present invention, FIG. 6 illustrates highly diagrammatically the bonding of a layer of oxidized and implanted silicon, and a stiffener, in a SMART-CUT® type process, FIGS. 7a, 8a and 9a visually represent the spatial distribution of the haze on the surface of three SOIs following their detachment by annealing, the SOI of FIG. 7a having undergone standard detachment annealing, the two SOIs of FIGS. 8a and 9a having undergone detachment annealings according to the present invention carried out according to different modalities, FIGS. 7b, 8b and 9b are graphs similar to those of FIG. 4b overall showing the distribution of haze for the SOI and respective of FIGS. 7a, 8a and 9a (FIG. 7b corresponding as does FIG. 4b to SOI annealing according to a known technique), FIGS. 10 to 12 are three similar representations of observation by microscope of the peripheral edge of three respective SOIs which have undergone detachment annealing, FIG. 10 corresponding to a SOI having undergone standard annealing (similar to FIG. 2), and FIGS. 11 and 12 correspond to the respective SOIs of FIGS. (8a, 8b) and (9a, 9b).

DETAILED DESCRIPTION OF THE PREFERRED EMBODIMENTS

The invention proposes a process of detaching two layers of material according to a weakened zone defined between the two layers. This process comprises thermal annealing of a structure 10 comprising the layers, with the annealing bringing the temperature from a starting annealing temperature to a final annealing temperature, wherein during the thermal annealing the annealing temperature evolves according to a first annealing phase to a transition temperature, then according to a second annealing phase during which the rise in temperature per unit of time is greater than that of the first phase.

In the case of structures such as multilayer substrates comprising, as above, SOI, SOA, or even AOA and a layer of a heel of re-usable material (silicon in the case of SOI), the shape of the structure is generally that of a very fine crust designated by the term wafer.

Generally, the first phase is an initiation phase of detachment, and the second phase is a surface-finishing phase, and the second phase is followed by a heating stage at a substantially constant temperature, which corresponds to the final annealing temperature.

According to another aspect, the invention also proposes application of a process according to one of the abovementioned aspects to detach two layers of material delimited by a weakened zone, wherein the weakened zone is produced within the scope of a process of the SMART-CUT® type.

A preferred material for the two layers is silicon, and the two layers of material can be two different layers of silicon, with one corresponding to an SOI, and the other layer corresponding to a silicon heel.

The wafers to be treated are generally arranged vertically in the oven, as shown in FIG. 3, with the wafers to be split being designated by reference numeral 10, the oven being designated by reference numeral 20.

This vertical arrangement of the wafers aims to prevent the risks of the two detached layers of each wafer shifting, relative to one another, at the end of detachment in the oven or in particular during subsequent handling operations when the detached wafers are removed from the oven.

As the specifications of the surface state are, in some cases, very specific (in particular for a SOI), it is necessary to try to prevent any relative shifting of the two detached layers so as to avoid the risks of any scratching on the surfaces of the two detached layers.

It is also noted, as illustrated in FIG. 4a, that the surface roughness of a SOI 11 resulting from detachment annealing exhibits dissymmetry. In fact, this figure shows a zone of the SOI surface (situated between 9 and 10 o'clock) in which the haze, and consequently the roughness, are increased.

Such divergence results from the presence of hot points in the annealing oven. In the case of an oven such as illustrated in FIG. 3, it is more precisely about the translation of the vertical temperature gradient. Generally, the wafers to be detached are placed in the oven at an orientation of 90° relative to the representation of FIG. 4a.

With reference now to FIG. 4b, this shows the overall distribution of haze on the surface of the SOI of FIG. 4a.

It will be recalled that this SOI has undergone detachment annealing according to a process known in the prior art. FIG. 4b illustrates that the value of the average haze on the whole SOI is of the order of 87 ppm. This value is directly associated with an average roughness value of this SOI, and thus represents a reference value for measuring SOI roughness, characterized by the haze measurement.

This haze measurement, as well as similar measurements to be specified hereinbelow, are made according to the same protocol and using the same instrument, in this case by an instrument of the KLA TENCOR SURFSCAN SPI™ type.

With reference now to FIG. 5, the evolution of the temperature prevailing in the annealing oven, during three detachment annealings, as a function of time, has been diagrammatically illustrated. More precisely, this figure comprises three curves 51, 52, 53 which correspond to three different types of annealing.

The start of the temperature evolution during these three annealings is identical, comprising an entry stage at 350° C., which corresponds to the annealing entry temperature, followed by a rising ramp of a temperature having a gradient of the order of 10° C. per minute or less, as is generally from the prior art.

In the right part of the figure it is noticed that over time the temperatures of the three annealings evolve differently. More particularly, the curve 51 illustrates the evolution of a detachment annealing according to the prior art.

In such annealing, after having been maintained at the entry level of 350° C. for a first stage the temperature evolves according to the known gradient ramp of the order of 10° C. per minute, up to a detachment annealing temperature and final temperature of the order of 500° C.

It is nevertheless specified that the so-called detachment start temperature, from which the beginning of detachment can be observed, may have a value of the order of 430° C. to 450° C.

The entry annealing temperature may have a value of less than 350° C. This will also be the case for annealings according to the present invention, illustrated by the curves 52 and 53.

The end of this annealing comprises a second stage, at this final annealing temperature.

In the case of this known annealing, the temperature therefore evolves according to a ramp.

The curve 52 represents the temperature evolution of annealing carried out according to the present invention, in a first embodiment.

It is to be observed in this case that after having followed a part of the standard ramp having a gradient of the order of 10° per minute or less, once the temperature has been brought to a transition value of the order of 430° C. to 450° C., temperature evolves according to a second ramp whereof the gradient is different to that of the first ramp.

The two ramps are illustrated as substantially linear. More precisely, the second ramp has a gradient substantially greater than that of the first ramp, the gradient of this second ramp being of the order of 16° C. per minute.

The difference in heating rate between the phases can range from at least about 20% to much greater proportions. An upper limit of an increase of about 80% is most often acceptable, although for certain materials other increases may be desirable. Generally, the heating rate in the second phase is about 33% to 67% and most preferably around 45% to 60% greater than that of the first phase.

Furthermore, for the annealing phases of the present invention, as well as for the preferred annealing phases represented by the curve 53, the two linear ramps can be replaced by two non-linear ramps corresponding to the same general evolution in two phases detached by a transition temperature, as long as the second phase corresponds to a more rapid rise in temperature or heating rate than that of the first phase.

The annealing ends with a stage at the final annealing temperature of the order of 600° C.

The curve 53 illustrates a variation of the invention, in which the second ramp again has a gradient of the order of 16° per minute after a transition to 430° C. to 450° C.

In this instance, the second ramp continues up to a final annealing temperature at an even greater value of the order of 800° C.

Accordingly, the detachment annealings according to the invention which correspond to curves 52 and 53 are performed with a rise in temperature comprising two phases having different respective average ramps:

a "slow" first phase, whose average ramp can have a relatively low average gradient of the order of 10° C./mm or less, followed by a "rapid" second phase, having an increased average gradient, such as on the order of 15° C./min or more, this second phase being intended to finalize detachment and to end, as will be explained, with an improved surface profile as well.

As noted above, the first and second heating rates or rises in temperature can be linear or not depending upon the specific material used, the size of the material, the intended method for obtaining detachment and the desired finish of the separated surfaces.

The first phase generally corresponds to classic annealing detachment ramp. The aim of this first phase, in the case of the invention, is to supply the wafer to be detached with thermal energy leading almost to detachment.

More precisely, the first phase ends at a transition temperature that corresponds to one that causes onset of detachment following the thermal energy supplied to the wafer during the first phase.

This onset of detachment is understood to mean the state in which a part of the weakened zone has effectively been separated, but that this separation has not spread though the entire weakened zone. This is accordingly a state in which the wafer comprises a split "bubble" at the level of its weakened zone.

In conventional annealing, such as that shown by curve 51, the detachment ramp continues beyond this detachment beginning along the same average gradient to complete the detachment in the situation where it is preferred to do so during the annealing.

In the case of the present invention, however, the temperature evolution gradient is increased so as to continue annealing in a second phase corresponding to a second ramp which is substantially greater than the gradient of the first phase.

It is specified that the transition temperature, which is, as we have seen, the temperature corresponding to the onset of detachment, will be adapted in terms of the nature and dimensions of the wafer to be detached; this adaptation could be made according to charts, or empirically.

In this respect, it should also be noted that the transition temperature corresponds more precisely to a thermal transition budget imparted to the wafer, which in turn corresponds to a state of the wafer in which onset of detachment takes place in the weakened zone of the wafer.

The aim of the second phase is to finalize detachment, by finishing up with a surface state, in particular a surface roughness, that is substantially improved relative to what is achieved from conventional annealing methods.

In following the first phase, after a transition temperature such as that defined and specified hereinabove, by a second phase of substantially increased average temperature gradient, the result is a surface state of the detached layers which is substantially improved relative to what is achieved by the detachment annealing processes of the prior art.

It should also be pointed out that the second phase, apart from the fact that it has an increased average gradient, preferably also brings the wafer to a final annealing temperature that is likewise substantially increased relative to the final temperature of annealing detachment according to the prior art. Both of these are on the order of 500° C., as illustrated by the curve 51. This is also illustrated by the final annealing temperatures of the curves 52 and 53. And this characteristic, combined with the strong average gradient associated with the second phase, actually results in a particularly advantageous surface state, the surface roughness of the detached layers decreasing further still.

To initiate detachment at a specific point on the weakened zone of the wafer, the divergence in temperature prevailing inside the oven can be exploited. For example, the presence of thermal gradients in an oven inside which the wafers are arranged vertically can be used to advantage.

In the case where the wafer to be detached has been made up by bonding two layers having varying mechanical characteristics, the respective mechanical behavior of the two bonded layers can also influence detachment of the layers.

This is the case for example for SOIs prepared according to the SMART-CUT® process, where the SOIs are obtained by detachment at a weakened zone constituted by implantation, of the SOI and the silicon heel. In this regard, detachment does not mean the operation consisting of undoing the "bonding" i.e., a bond which had been created by adhesion.

Therefore, in the case of detachment of a wafer to constitute a SOI, a bonding interface is created by bonding between the oxidized and implanted plate and the stiffener, and detachment takes place at the level of the weakened zone created by implantation, this weakened zone being distinct from the bonding interface, even if it is in fact very close in position to the interface.

In this case, the two "layers" to be detached are therefore (1) both the SOI itself comprising the stiffener, the oxide and the fine slice or layer of silicon that is to become a semiconductor substrate, and (2) the silicon heel.

Given the extreme fineness of the oxide and the fine layer of silicon of the SOI, the SOI has mechanical characteristics which are compatible with those of the stiffener, such that the two layers to be detached have the respective mechanical characteristics of silicon and of the stiffener, even if the stiffener is of a different material. The stiffener is preferably made of silicon, but also can be any one of a wide range of other materials, such as quartz.

From the point of view of the mechanical characteristics of the layers, each layer to be detached from the SOI can be assimilated respectively into two layers, which were previously bonded together, to make up the wafer to be detached, i.e., the silicon layer and the stiffener.

The following applies to detachment of two layers which are compatible in the same way into two layers previously bonded together, wherein each of the layers to be detached is essentially composed of the material of one of these two layers.

And with reference to the influence of the mechanical behavior of the layers to be detached, the two layers to be detached from the SOI (the silicon heel and the SOI itself) can thus have different mechanical characteristics).

In addition, these two layers are obviously equivalent from the mechanical point of view to a layer of silicon, and to the stiffener (these two elements having been assembled by bonding).

The two such bonded layers are not exactly flat, but there are tolerances on the surface evenness of such layers.

And bonding the two layers together (i.e., the oxidized and implanted silicon S, and stiffener R, as shown in FIG. 6), was done so that the concavities of the two respective layers face one another, as is shown diagrammatically in the figure. In this figure the concavities of the two bonded layers have been shown greatly exaggerated than in reality, and do not correspond in any way to a realistic scale.

During such bonding the concavities of the two layers are flattened so as to molecularly bond the surfaces of the two layers together. The two layers of the resulting wafer (and consequently the two layers to be detached, given that it was seen that mechanically these two layers were equivalent to the two bonded layers) are thus slightly prestressed especially in their central region.

These two layers will thus tend to move apart from one another as soon as detachment has been initiated in a movement of relaxing the constraints due to the abovementioned molecular bonding. This benefits continuing detachment after the initial detachment described above and achieved on completion of the first phase of annealing.

This relaxation phenomenon becomes useful for detachment according to the present invention of any wafer whereof the two layers to be detached can be assimilated into two slices which have previously been bonded together, by subjecting them to prestressing as they are adjusted to one another.

With reference to the process according to the present invention in general, it has been said that the final annealing temperatures are greater than the final annealing temperatures of the prior art. More precisely, in a preferred variant of the invention beneficial results will be obtained with final annealing temperatures of the order of 500° C. to 800° C. And even more precisely, according to a preferred option for implementing the invention the final annealing temperature is of the order of 600° C.

The gradient of the second ramp known as the rapid ramp is not necessarily 16° per minute. This non-limiting value can be adapted top the particulars of the situation and preferred values can be routinely determined by one of ordinary skill in the art. In any case, that value it must be substantially greater than the value of the gradient of temperature rise in the first ramp.

Similarly, the final annealing temperature, if effectively selected to be substantially higher than for classic detachment annealings, is not limited to the values described above which constitute preferred values only.

Also, the profile of temperature rise in two rectangular ramps represented in the curves 52 and 53 constitutes only a particular mode of utilizing the invention.

In fact, a general characteristic of such annealing carried into effect according to the present invention is that it comprises a first phase during which the temperature is brought from a starting annealing temperature (which can have a value of up to 350° C., as has been mentioned) to a temperature corresponding to a starting detachment temperature for the wafer.

It is specified that the onset of detachment can for example be observed by following, using any means known in and of itself, the diameter of gaseous bubbles generated by the detachment annealing from a weakened zone defined by implantation, the gaseous bubbles originating from the combination of micro-bubbles, micro-cavities or microcracks that are formed in the structure by the implanted ions.

This first phase corresponds to the first slow ramp of the curves 52 and 53.

This is followed by a second phase during which not only is the rise in temperature continued, but even the growth in temperature is increased per unit of time. This is different from the stabilized temperature that is used in known detachment annealings, where the final annealing temperature corresponds to a temperature which is only slightly greater than the starting detachment temperature.

Therefore, it is seen that the first phase corresponds to the mechanical triggering of detachment, while the second intensive annealing phase allows not only finalizing of this detachment, but also obtaining a very good surface state, this second phase corresponding to a finishing phase.

The starting detachment temperature, which corresponds to the transition temperature between the two annealing phases, can vary in terms of the characteristics of the structure to be detached.

In effect, the value of 430° C. to 450° C. mentioned above is not strictly limiting: in terms of characteristics such as the material(s) of the structure, the dose of implantation energy utilized during the creation of the weakened zone (when this zone has been created by implantation), this temperature may vary to a certain extent.

For example, if the weakened zone is created by implantation, then before the thermal budget is supplied to cause initial separation or bubbling, it has to be adapted when the implantation energy is modified.

FIGS. 7a to 9a illustrate the differences in spatial distribution of haze on the surface of three SOIs which have undergone detachment annealings according to three different modalities.

FIG. 7a thus illustrates distribution of haze on the surface of a SOI which has undergone classic detachment annealing, corresponding to the curve 51 of FIG. 5.

This figure is to be compared to FIG. 7b, which, following the example of FIG. 4b, illustrates global distribution of haze on the surface of the SOI, and an average value of the order of 87 ppm.

FIG. 8a illustrates the spatial distribution of haze on the surface of a SOI which has undergone detachment annealing according to the invention, with a temperature evolution corresponding to the curve 52 of FIG. 5.

This figure is to be compared to FIG. 8b, from which an average haze value of the order of 73 ppm on the surface of the SOI is deduced.

A substantial decrease is noticed in the value of average haze and, consequently, of roughness on the surface of the SOI resulting from detachment.

FIGS. 9a and 9b correspond to another SOI, having undergone detachment annealing according to a temperature evolution according to the curve 53 of FIG. 5.

In this case, as shown more particularly in FIG. 8b, the average value of haze on the surface of the SOI is of the order of 5 ppm.

This corresponds to an extremely significant decrease in the resultant surface roughness of the SOI compared to that obtained from known annealing processes.

FIGS. 10 to 12 illustrate the evolution of the state of the crown of three respective SOIs which have undergone detachment annealing according to the three respective modalities described above (corresponding to the three respective curves 51, 52, 53 of FIG. 5).

These FIGS. 10 to 12 illustrate a significant decrease in the peripheral degradation of the SOI structure, with the most degraded structure corresponding to classic annealing, the best preserved structure corresponding to annealing done according to the present invention and corresponding to the curve 53 of FIG. 5.

It is specified that although the abovementioned examples have been described in reference to detachment, thus generating a SOI, the invention applies to detachment of any other structure comprising weakened zone which effectively delimits the layers to be detached.

What is claimed is:

1. A process for detaching of two layers of material along a weakened zone defined between the layers, which process comprises thermal annealing of a structure that includes the two layers by conducting a first and second annealing phases that are separated by a transition temperature, and raising the temperature in the second annealing phase at a rate that is greater than that of the first annealing phase so as to provide an improvement in surface roughness of detached surfaces compared to those obtained by an annealing process where the temperature is uniformly raised.

2. The process of claim 1, wherein the temperature is raised in the second annealing phase at a rate that is at least 20 to 80% greater than that of the first annealing phase.

3. The process of claim 2, wherein the temperature is raised in the second annealing phase at a rate that is at least 33 to 67% greater than that of the first annealing phase.

4. The process of claim 2, wherein the temperature rises in the first annealing phase uniformly at a relatively slow average gradient of no greater than about 10° C./min.

5. The process of claim 2, wherein the temperature rises in the second annealing phase at a relatively rapid average gradient of at least about 15° C./min or greater.

6. The process of claim 1, wherein the material of the layers comprises a semiconductor material.

7. The process of claim 6, wherein the transition temperature corresponds to a temperature that is just below that which causes detachment of the layers.

8. The process of claim 7, wherein the transition temperature is about 430° C. to 450° C.

9. The process of claim 6, wherein the first annealing phase begins at a temperature of no greater than about 350° C.

10. The process of claim 6, wherein the second annealing phase ends at a temperature of about 500° C. to 800° C.

11. The process of claim 10, wherein the final annealing temperature is on the order of about 600° C.

12. The process of claim 10, wherein the second annealing phase is followed by a heating stage at a substantially constant temperature of about 500° C. to 800° C.

13. The process of claim 12, wherein the substantially constant temperature of the subsequent heating stage is 600° C.

14. The process of claim 6, wherein the weakened zone is created by the implanting of ions or the provision of a porous layer.

15. The process of claim 1, wherein the two layers are part of a silicon on insulator structure that is provided by:

forming an oxide layer in an upper plate of silicon, implanting ions in the upper plate to create the weakened zone which delimits the silicon on insulator structure and a silicon heel, and bonding the upper plate onto a stiffener, so that the thermal annealing detaches along the weakened zone, as one layer, a silicon on insulator structure comprising the stiffener, the embedded oxide layer and a layer of silicon located between the embedded oxide layer, and, as the other layer, a silicon heel for re-use in further operations.

* * * * *